United States Patent
Cho et al.

(10) Patent No.: US 7,468,317 B2
(45) Date of Patent: Dec. 23, 2008

(54) METHOD OF FORMING METAL LINE OF SEMICONDUCTOR DEVICE

(75) Inventors: Jik Ho Cho, Kyeongki-do (KR); Tae Kyung Kim, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 252 days.

(21) Appl. No.: 11/593,882

(22) Filed: Nov. 7, 2006

(65) Prior Publication Data
US 2008/0003808 A1    Jan. 3, 2008

(30) Foreign Application Priority Data
Jun. 28, 2006    (KR) ...................... 10-2006-0058695

(51) Int. Cl.
*H01L 21/44* (2006.01)
(52) U.S. Cl. ...................... 438/622; 438/624; 438/626; 438/692; 438/719; 438/723; 257/E21.261; 257/E21.275; 257/E21.276; 257/E21.396; 257/E21.586
(58) Field of Classification Search ................ 438/589, 438/622, 624, 626, 692, 719, 723, 724, 734, 438/751, 756, 757; 257/E21.241, 261, 276, 257/277, 396, 424, 564, 584, 585, 586, E29.267
See application file for complete search history.

(56) References Cited

U.S. PATENT DOCUMENTS 5,581,110 A * 12/1996 Razouk et al. .............. 257/513
6,077,768 A * 6/2000 Ong et al. ................... 438/622
6,380,065 B1 * 4/2002 Komai et al. ................ 438/622
6,423,618 B1 * 7/2002 Lin et al. .................... 438/589
7,202,160 B2 * 4/2007 Kim et al. ................... 438/624

FOREIGN PATENT DOCUMENTS

KR    1998/056165    9/1998
KR    2004/059980    7/2004

* cited by examiner

*Primary Examiner*—Michael S Lebentritt
(74) *Attorney, Agent, or Firm*—Marshall, Gerstein & Borun LLP

(57) ABSTRACT

A method of forming a metal line, in which a nitride layer is used instead of a metal barrier layer, enabling a metal line structure with a relatively low resistance and therefore realizing a high integration of a device. In the method of forming the metal line of the semiconductor device, a first insulating layer and a second insulating layer with a different etch selectivity are sequentially formed on a semiconductor substrate. Predetermined regions of the first insulating layer and the second insulating layer are sequentially etched to form a contact hole. A metal barrier layer is formed on the entire surface including the contact hole. A first metal material is deposited on the entire surface to gap-fill the contact hole. The first metal material on the second insulating layer is stripped such that the first metal material remains only within the contact hole, thus forming a contact plug. A metal line is formed on a predetermined region of the second insulating layer including the contact plug.

9 Claims, 3 Drawing Sheets

METHOD OF FORMING METAL LINE OF SEMICONDUCTOR DEVICE

BACKGROUND OF THE INVENTION

Field of the Invention

The invention relates, in general, to semiconductor devices and, more particularly, to a method of forming a metal line, in which a nitride layer is used instead of a metal barrier layer, thereby enabling a metal line structure with a relatively low resistance and therefore realizing a high integration of a device.

As semiconductor devices become more highly integrated, miniaturized, and high speed, the problem of securing contact process margin increases. There is also a need for devices with a high signal transfer speed in order to process information rapidly.

In general, a polysilicon layer with a high thermal stability has typically been used as the electrodes of semiconductor devices, such as bit lines. However, the polysilicon layer has high resistance compared with a metal layer. Accordingly, a metal-polyside structure layer in which a polysilicon layer and a metal-silicide layer are laminated has recently been widely used. However, as semiconductor devices become more highly integrated, a replacement material, which has an electrical conductivity better than that of polysilicon or metal-silicide, need to be used as the electrodes of the devices.

For this reason, tungsten (W) has recently been used as the replacement material. Tungsten has also been widely used as the material of metal lines. In the case where tungsten is applied to electrodes, such as bit lines, or metal lines, a metal barrier layer made of a titanium/titanium nitride (Ti/TiN) layer, etc. is formed. The titanium layer serves as an adhesive layer for allowing tungsten, which is the main material of a metal line, and an underlying layer to be well adhered together. The titanium nitride layer serves as a metal ion anti-diffusion layer for preventing tungsten, which is the main material of a metal line, and a silicon substrate from directly reacting each other. The metal barrier layer also serves to prevent the undercut of a tungsten line from occurring at the time of an etch process of forming the tungsten line.

If tungsten is directly deposited without forming the metal barrier layer on an oxidization layer, undercut occurs in the tungsten line due to oxygen generated by the reaction of an etch gas and the oxidization layer. However, if the metal barrier layer is formed on the oxidization layer, the metal barrier layer becomes an etch-stop layer in the etch process and prevents contact between the oxidization layer and the etch gas. Accordingly, the occurrence of oxygen in the oxidization layer can be prevented.

However, if the metal barrier layer is used as described above, a problem arises because a line resistance is increased. In other words, if tungsten is deposited on the metal barrier layer, tungsten becomes a complete polycrystalline structure of a micro grain structure due to the influence of a micro grain structure of titanium/titanium nitride. Accordingly, the resistance of tungsten is increased, the conductivity is decreased, and an advantage in which tungsten having a low resistivity is used is reduced.

SUMMARY OF THE INVENTION

Accordingly, the invention addresses the above problems, and provides a method of forming a metal line, in which a nitride layer is formed instead of a metal barrier layer, enabling a tungsten line having a low resistance to be formed and therefore realizing a high integration of a device.

In a method of forming a metal line of a semiconductor device according to an aspect of the invention, a first insulating layer and a second insulating layer with a different etch selectivity are sequentially formed on a semiconductor substrate. Predetermined regions of the first insulating layer and the second insulating layer are sequentially etched to form a contact hole. A metal barrier layer is formed on the entire surface including the contact hole. A first metal material is deposited on the entire surface to gap-fill the contact hole. The first metal material on the second insulating layer is stripped such that the first metal material remains only within the contact hole, thus forming a contact plug. A metal line is formed on a predetermined region of the second insulating layer including the contact plug.

DESCRIPTION OF SPECIFIC EMBODIMENTS

Specific embodiments according to the invention are described below with reference to the accompanying drawings.

FIGS. 1 to 5 are cross-sectional views illustrating a method of forming a metal line of a semiconductor device according to an embodiment of the invention.

Figure 1:
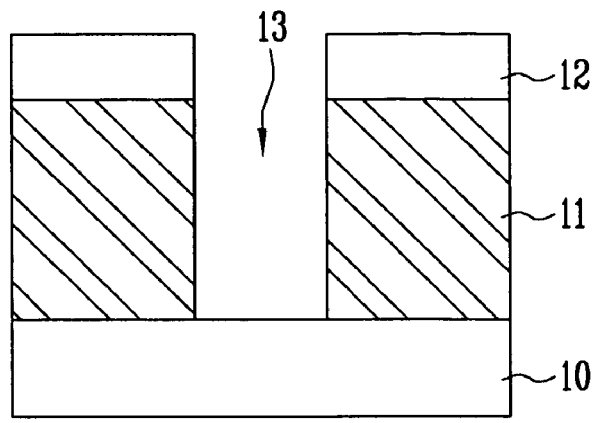
FIGS. 1 to 5 are cross-sectional views illustrating a method of forming a metal line of a semiconductor device according to an embodiment of the invention.

Referring to FIG. 1, an insulating layer 11 and a nitride layer 12 are sequentially formed on a semiconductor substrate 10. The nitride layer 12 and the insulating layer 11 are etched so that the semiconductor substrate 10 is exposed, thereby forming a contact hole 13.

Figure 2:
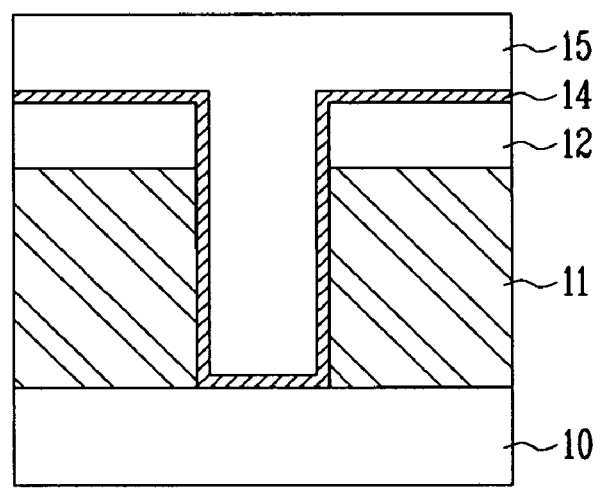

Referring to FIG. 2, a metal barrier layer 14 is formed on the entire surface including the contact hole 13 (refer to FIG. 1). For example, the metal barrier layer 14 may be formed using a titanium/titanium nitride (Ti/TiN) layer by means of Chemical Vapor Deposition (CVD), Physical Vapor Deposition (PVD), or the like.

A first tungsten layer 15 is deposited on the metal barrier layer 14 to completely gap-fill the space of the contact hole 13 with tungsten. The first tungsten layer 15 is preferably deposited by CVD using $SiH_4/WF_6$ or $WF_6/H_2$ as a reaction gas.

Figure 3:
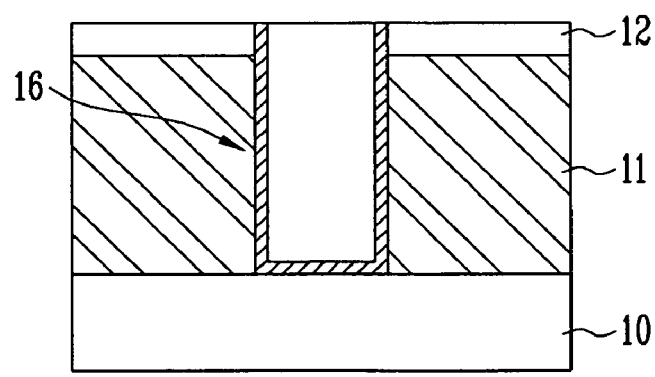

Referring to FIG. 3, the first tungsten layer 15 over the nitride layer 12 is stripped by CVD or an etch-back method until the first tungsten layer 15 remains only within the contact hole 13, thus forming a contact plug 16.

In the above, when the first tungsten layer 15 is stripped, the entirety of the metal barrier layer 14 on the nitride layer 12 and a portion of the nitride layer 12 are stripped. The remaining thickness of the nitride layer 12 after being stripped is preferably within a range of 50 Å to 500 Å.

Figure 4:
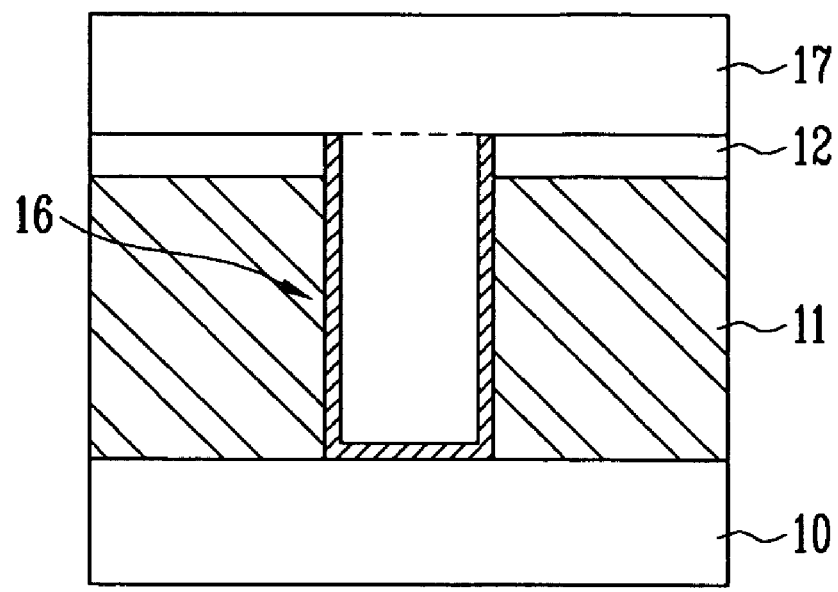
Figure 6A:
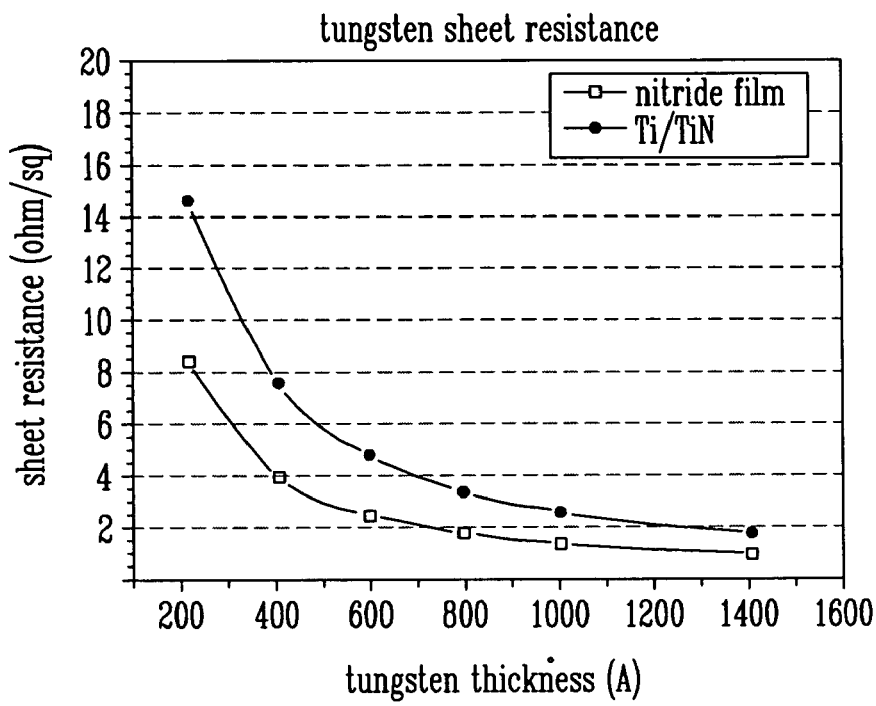
FIGS. 6A and 6B are graphs illustrating the sheet resistance and resistivity of tungsten depending on a nitride layer and Ti/TiN, respectively.
Figure 6B:
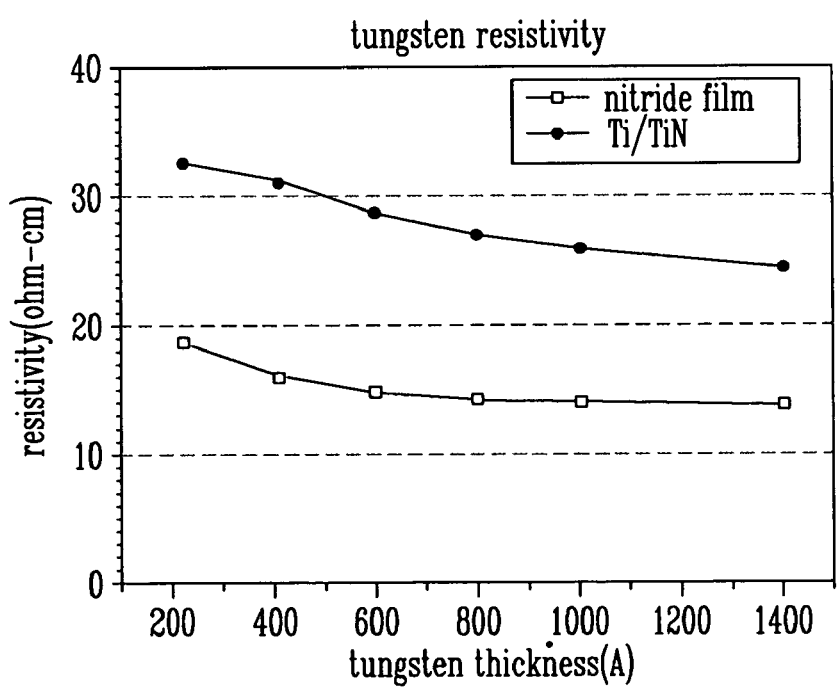

Referring to FIG. 4, a second tungsten layer 17 is deposited on the entire surface preferably by means of PVD. The second tungsten layer 17 has an increased grain size compared with when it is deposited on the titanium/titanium nitride layer under the influence of the nitride layer 12, which is amorphous, since it is deposited on the nitride layer 12. Accordingly, tungsten formed on the nitride layer 12 has a sheet resistance and resistivity, which is lower about a half than that of tungsten formed on the titanium/titanium nitride layer, as shown in FIGS. 6A and 6B.

Figure 5:
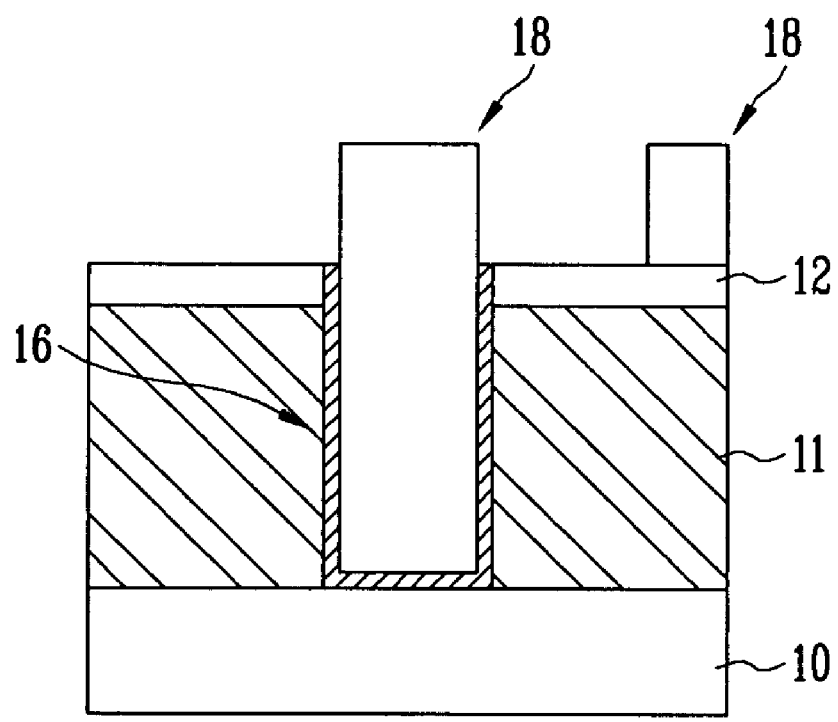

Referring to FIG. 5, a mask process and an etch process are performed on the second tungsten layer 17 to form a metal line 18. At this time, the nitride layer 12 precludes reaction between an etch gas, which is used at the time of the etch process, and the oxidization layer 11, thus prohibiting the formation of $O_2$. Accordingly, the nitride layer 12 can prevent the undercut phenomenon of the metal line 18.

As described above, according to the invention, tungsten is deposited on the nitride layer to form the metal line. Accordingly, a sheet resistance and resistivity can be reduced by about a half compared with when tungsten is deposited on the metal barrier layer.

Meanwhile, the nitride layer precludes reaction between an etch gas and the oxidization layer when the tungsten line is formed. It is therefore possible to prevent the undercut phenomenon of the metal line. Accordingly, since a tungsten line having a lower resistance can be formed, high integration of devices can be realized.

Although the foregoing description has been made with reference to various embodiments changes and modifications may be made by those of ordinary skill in the art without departing from the spirit and scope of the invention.

What is claimed is:

1. A method of forming a metal line of a semiconductor device, the method comprising the steps of:
   sequentially forming a first insulating layer and a second insulating layer with different etch selectivities on a semiconductor substrate;
   sequentially etching predetermined regions of the first insulating layer and the second insulating layer to form a contact hole;
   forming a metal barrier layer on the entire surface including the contact hole;
   depositing a first metal material on the entire surface so that the contact hole is gap-filled;
   stripping the first metal material on the second insulating layer so that the first metal material remains only within the contact hole, thus forming a contact plug; and
   forming a metal line on a predetermined region of the second insulating layer including the contact plug.

2. The method of claim 1, comprising, when the contact plug is formed, stripping the metal barrier layer on the second insulating layer.

3. The method of claim 2, comprising when the metal barrier layer on the second insulating layer is stripped, partially stripping the second insulating layer.

4. The method of claim 3, wherein a thickness of the second insulating layer, which remains after the second insulating layer is partially stripped, is within a range of 50 Å to 500 Å.

5. The method of claim 1, comprising stripping the first metal material by a Chemical Mechanical Polishing (CMP) process or an etch-back process.

6. The method of claim 1, wherein the first metal material is tungsten.

7. The method of claim 1, comprising forming the metal line by a mask process and an etch process after forming a second metal material on the second insulating layer.

8. The method of claim 7, wherein the second metal material is tungsten.

9. The method of claim 1, wherein the first insulating layer is an oxidization layer, and the second insulating layer is a nitride layer.

* * * * *